(12) United States Patent
Sato et al.

(10) Patent No.: US 10,181,451 B2
(45) Date of Patent: Jan. 15, 2019

(54) ELECTRONIC COMPONENT MOUNTING APPARATUS

(71) Applicant: SHINKAWA LTD., Tokyo (JP)

(72) Inventors: Akira Sato, Tokyo (JP); Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 165 days.

(21) Appl. No.: 15/430,563

(22) Filed: Feb. 13, 2017

(65) Prior Publication Data

US 2017/0154865 A1     Jun. 1, 2017

Related U.S. Application Data

(63) Continuation of application No. PCT/JP2014/077402, filed on Oct. 15, 2014.

(30) Foreign Application Priority Data

Aug. 11, 2014  (JP) .................................. 2014-163690
Sep. 29, 2014  (JP) .................................. 2014-198052

(51) Int. Cl.
*H05K 13/04*    (2006.01)
*H01L 23/00*    (2006.01)
(Continued)

(52) U.S. Cl.
CPC ........ *H01L 24/75* (2013.01); *H01L 21/67144* (2013.01); *H05K 13/04* (2013.01);
(Continued)

(58) Field of Classification Search
CPC .. H05K 13/04; H05K 13/0413; H05K 13/082; H01L 21/67144; H01L 24/75; H01L 2223/75755; H01L 2224/7592
See application file for complete search history.

(56) References Cited

U.S. PATENT DOCUMENTS 5,985,064 A      11/1999  Sato
6,337,489 B1 *   1/2002   Matsumoto ....... H01L 21/67144
                                                    228/105
(Continued)

FOREIGN PATENT DOCUMENTS

EP          2922378       9/2015
JP          2002-043797   2/2002
(Continued)

*Primary Examiner* — Carl Arbes
(74) *Attorney, Agent, or Firm* — JCIPRNET (57) ABSTRACT

A mounting apparatus includes: a mounting tool; a supporting mechanism; a first pressurizing mechanism having a Z axis motor as a drive source for moving the mounting tool in the vertical direction together with the supporting mechanism so as to apply a first load to the electronic component; a second pressurizing mechanism having a VCM as a drive source provided between the supporting mechanism and the mounting tool, and for moving the mounting tool in the vertical direction with respect to the supporting mechanism so as to apply a second load to the electronic component; a load cell; and a control unit configured to control driving of the first pressurizing mechanism and the second pressurizing mechanism, the control unit previously driving the second pressurizing mechanism to bring the load cell into contact with the supporting mechanism and generate precompression when the first load is applied by the first pressurizing mechanism.

2 Claims, 8 Drawing Sheets (51) Int. Cl.
*H01L 21/67* (2006.01)
*H05K 13/08* (2006.01)

(52) U.S. Cl.
CPC ....... *H05K 13/0413* (2013.01); *H05K 13/082* (2018.08); *H01L 2224/7592* (2013.01); *H01L 2224/75755* (2013.01)

(56) References Cited

U.S. PATENT DOCUMENTS 7,075,036 B2 * 7/2006 Ogimoto .............. B23K 20/023
219/243
7,591,409 B2 * 9/2009 Naito .................... B23K 20/10
228/103

FOREIGN PATENT DOCUMENTS

| | | |
|---|---|---|
| JP | 2002-299894 | 10/2002 |
| JP | 3449139 | 9/2003 |
| JP | 2004-158743 | 6/2004 |
| JP | 2006-147702 | 6/2006 |
| JP | 2008-251727 | 10/2008 |
| JP | 2009-027105 | 2/2009 |
| JP | 4367740 | 11/2009 |
| WO | 2014076809 | 5/2014 |

\* cited by examiner

ELECTRONIC COMPONENT MOUNTING APPARATUS

CROSS REFERENCE TO RELATED APPLICATIONS

This application is a Continuation of PCT International Application No. PCT/JP2014/077402, filed on Oct. 15, 2014, which claims priority under 35 U.S.C § 119(a) to Patent Application No. 2014-163690, filed in Japan on Aug. 11, 2014, and Patent Application No. 2014-198052, filed in Japan on Sep. 29, 2014, all of which are hereby expressly incorporated by reference into the present application.

TECHNICAL FIELD

The present invention relates to an electronic component mounting apparatus for mounting an electronic component such as a semiconductor chip onto a substrate.

BACKGROUND ART

Conventionally, electronic component mounting apparatuses for mounting an electronic component such as a semiconductor chip onto a substrate have been widely known. With such a mounting apparatus, an electronic component is bonded to a substrate via a connecting member. A load applied to the electronic component at this time is determined depending on a material of the connecting member, a type of the semiconductor chip, and the like. For example, if the connecting member is a paste-like adhesive agent, the load to be applied is a relatively low bonding load (low load) from about 0.1 N to 50 N. If the connecting member is an anisotropically conductive sheet, a solder bump, or the like, the load to be applied is a relatively high bonding load (high load) from about 10 N to 500 N. Further, the bonding load may vary depending on progress of a mounting process. In some cases, for example, when an electronic component is bonded to a substrate, temporary mounting is performed by applying a low load to the electronic component in an early step of the bonding, and then real mounting is performed by applying a high load to the electronic component. As described above, a range of the load required for bonding is vast.

Therefore, a bonding apparatus capable of switching a bonding load has conventionally been proposed. For example, PTL 1 discloses an apparatus including first pressing force application means that presses a bonding block for applying a high load and second pressing force application means for applying a low load, wherein a bond tool is fixed to the bonding block when a high load is applied, and the bond tool is not fixed to the bonding block when a low load is applied.

Further, PTL 2 discloses an apparatus including first pressurization means for applying a low load and second pressurization means for applying a high load, wherein the first pressurization means is configured to move together with a bonding head, and the second pressurization means is positioned above a bonding stage separately from the bonding head. The apparatus according to PTL 2 further includes pressurizing source switch means that transmits a pressurizing force applied from the first pressurization means to the bonding tool during low load control, and that does not transmit a pressurizing force applied from the first pressurization means to the bonding tool during high load control.

CITATION LIST

Patent Literature

PTL 1: Japanese Patent No. 4367740
PTL 2: Japanese Unexamined Patent Application Publication No. 2009-27105

SUMMARY OF INVENTION

According to the conventional techniques, it is possible to apply a low load and a high load only with a single mounting head. However, the technique of PTL 1 requires a complicated mechanism in order to fix and release the bond tool to the bonding block, which results in problems such as complication of the apparatus as a whole and increased costs. Further, the technique of PTL 2 has a problem that as the second pressurization means that applies a high load is provided separately from the bonding head, a position at which a high load is applied is limited. In addition, PTL 2 requires a mechanism for switching transmission paths of a pressurizing force, which also results in problems such as complication of the apparatus as a whole and increased costs.

Thus, the present invention provides an electronic component mounting apparatus having a more simplified configuration capable of applying both a low load and a high load to an electronic component accurately.

Solution to Problems

An electronic component mounting apparatus according to the present invention includes: a mounting tool configured to hold an electronic component at a tip end of the tool; a supporting mechanism movable in a vertical direction and coupled with the mounting tool; a first pressurizing mechanism configured to move the mounting tool in the vertical direction together with the supporting mechanism so as to apply a first load to the electronic component; a second pressurizing mechanism provided between the supporting mechanism and the mounting tool, and configured to move the mounting tool in the vertical direction with respect to the supporting mechanism so as to apply a second load to the electronic component; a load detector connected to the mounting tool either directly or indirectly; and a control unit configured to control driving of the first pressurizing mechanism and the second pressurizing mechanism, the control unit previously driving the second pressurizing mechanism to bring the load detector into contact with the supporting mechanism and generate precompression when the first load is applied by the first pressurizing mechanism.

The load detector may be disposed between the supporting mechanism and the second pressurizing mechanism. The apparatus may further include: a guiding mechanism configured to guide movement of the mounting tool in the vertical direction with respect to the supporting mechanism, wherein the guiding mechanism is constituted by an elastic body that couples the mounting tool with the supporting mechanism, displacement of the guiding mechanism being restricted in a horizontal direction and allowed in the vertical direction. In this case, the elastic body may be a leaf spring.

The control unit may perform feedback control of the first pressurizing mechanism according to a load detect by the load detector during pressurization by the first pressurizing mechanism, and perform feedforward control of the second pressurizing mechanism during pressurization by the second pressurizing mechanism.

According to the present invention, it is possible to apply both a low load and a high load to an electronic component accurately with a simplified configuration.

DESCRIPTION OF EMBODIMENT

Figure 1:
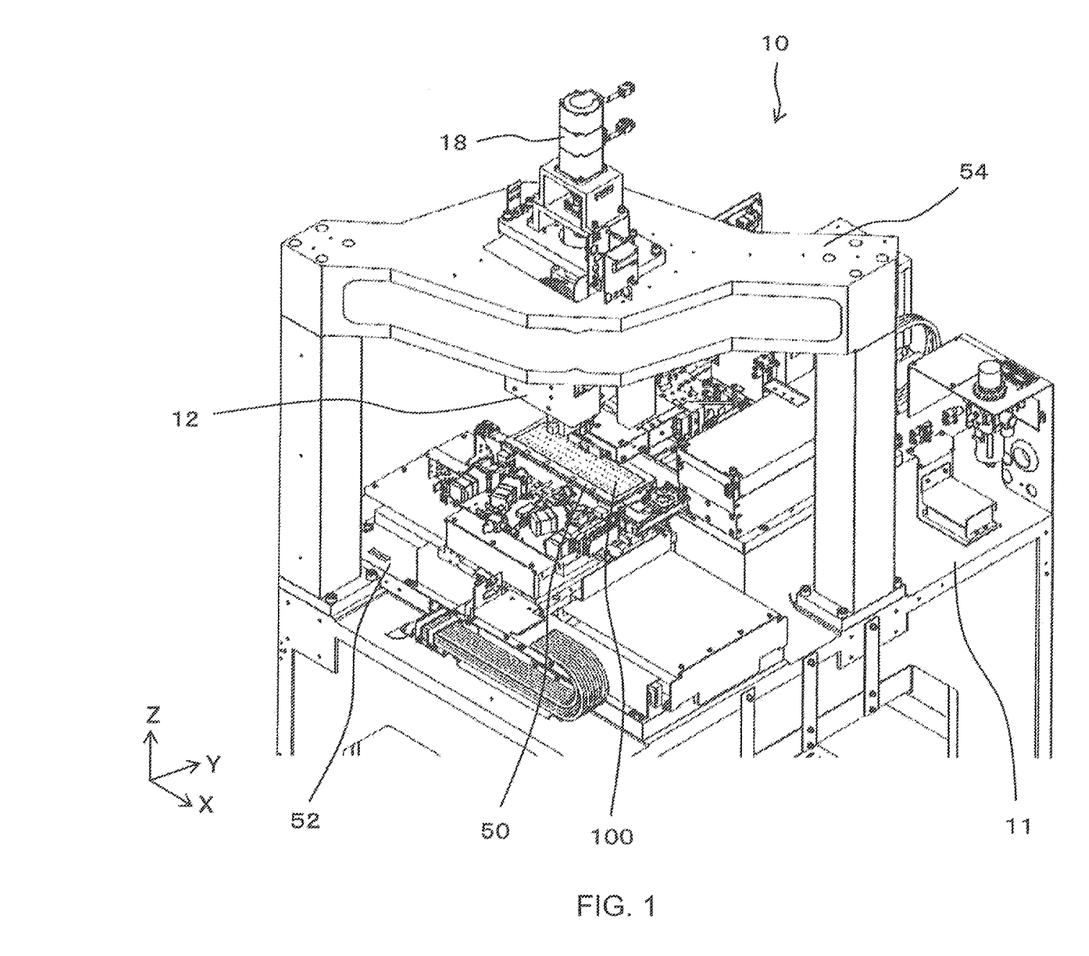
FIG. 1 is a perspective view of an electronic component mounting apparatus according to an embodiment of the present invention.
Figure 2:
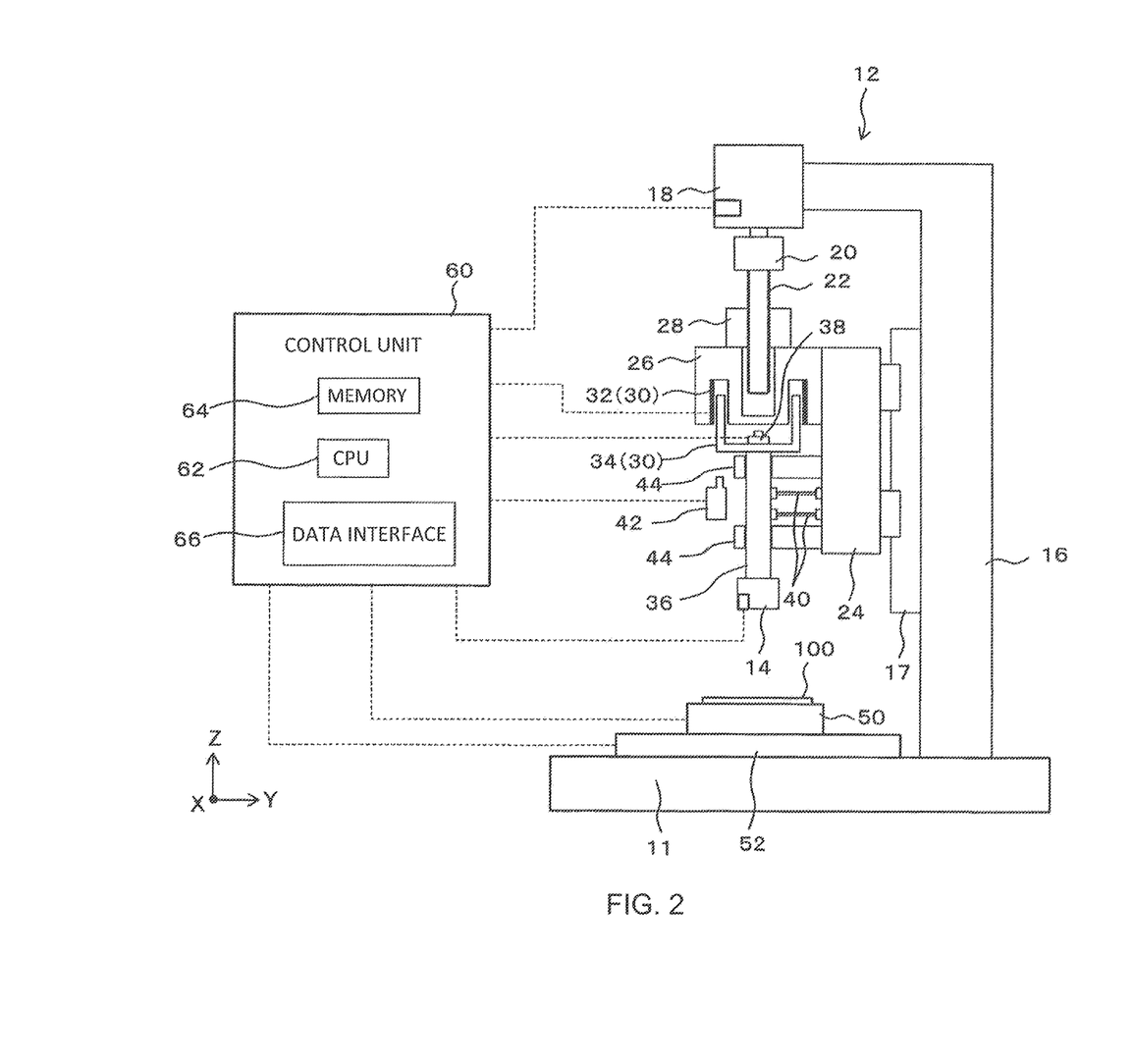
FIG. 2 is a schematic configurational diagram of the electronic component mounting apparatus.
Figure 3:
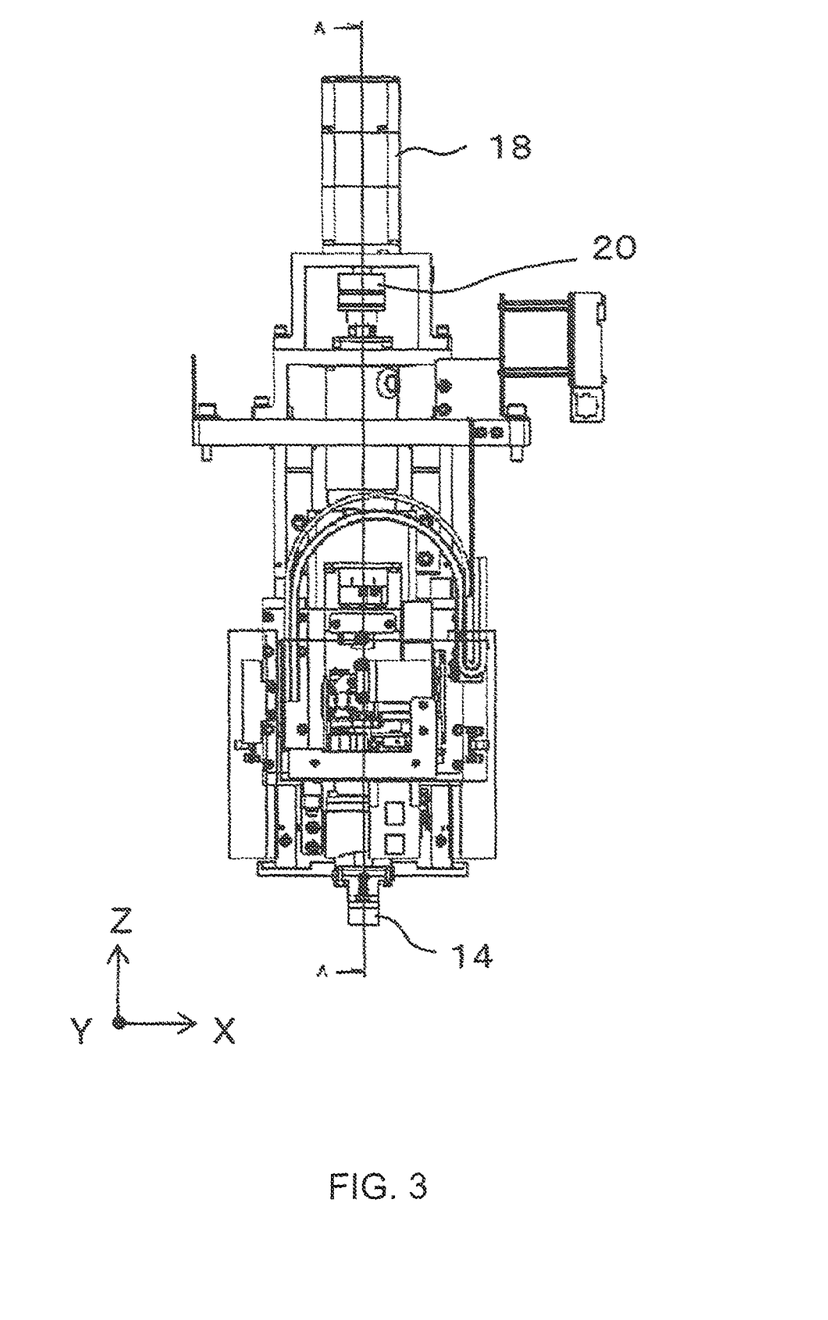
FIG. 3 is a front view of a mounting head.
Figure 4:
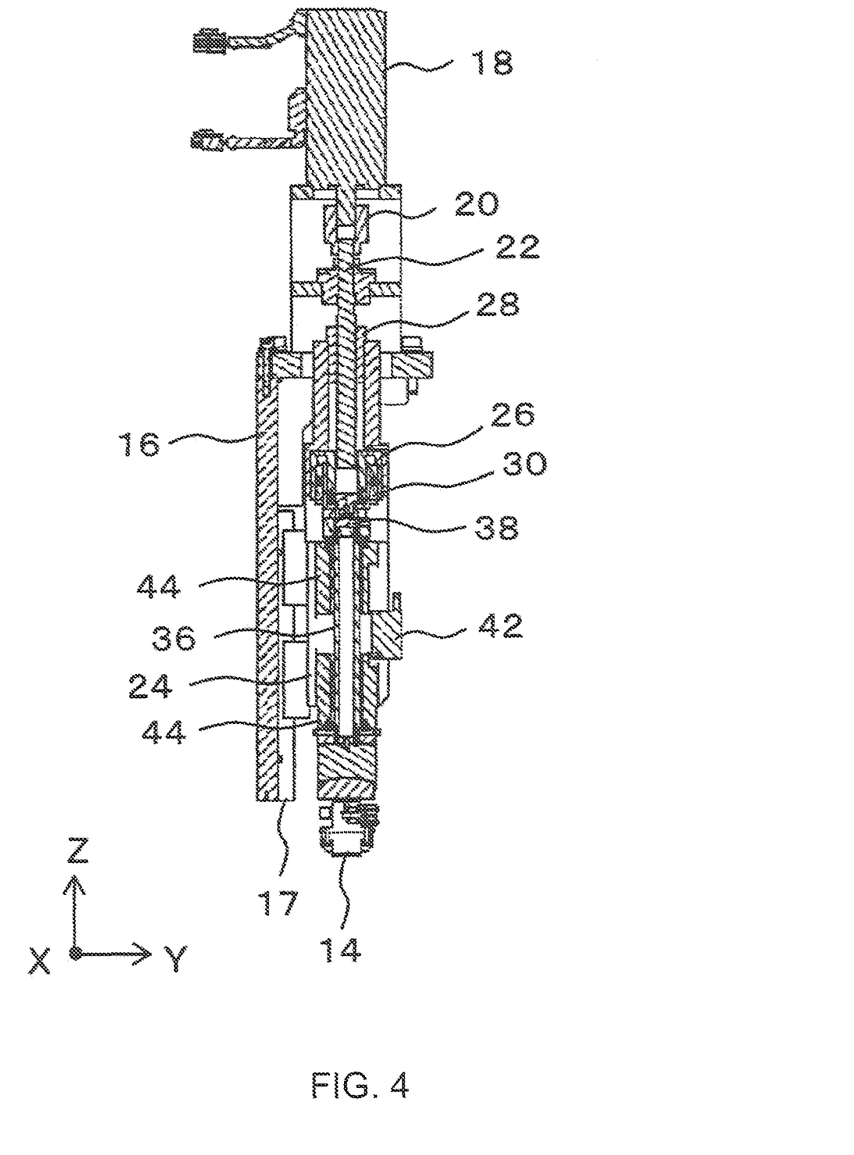
FIG. 4 is a cross-sectional view taken along line A-A in FIG. 3.
Figure 5:
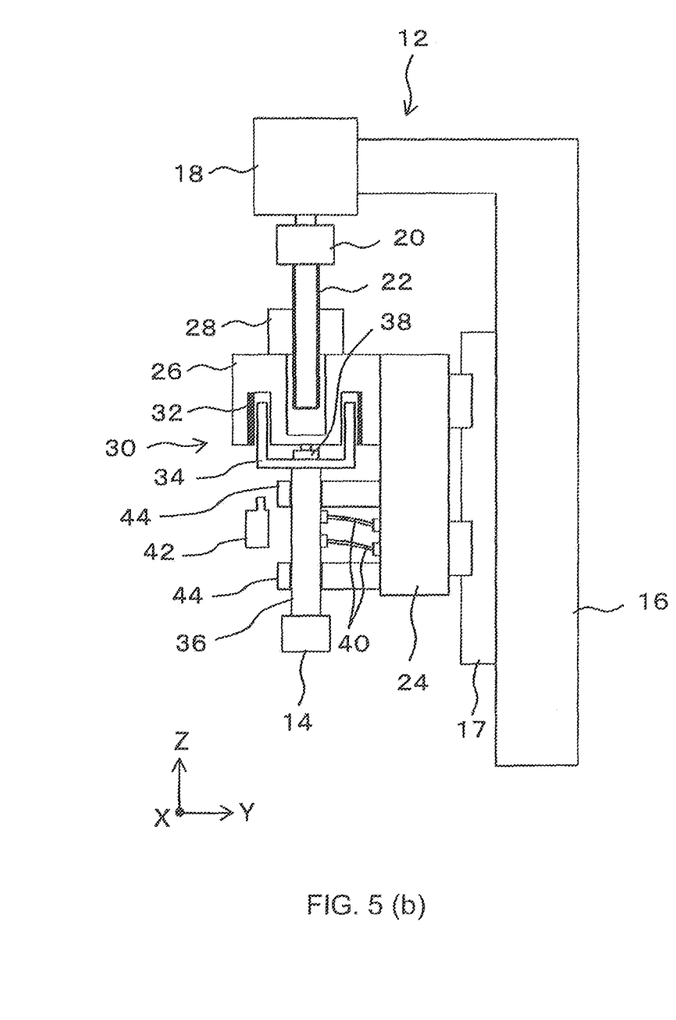
FIGS. 5(a) and 5(b) are schematic configurational diagrams of the mounting head.

Hereinafter, an embodiment of the present invention will be described with reference to the drawings. FIG. 1 is a perspective view of an electronic component mounting apparatus 10 according to the embodiment of the present invention. Further, FIG. 2 is a schematic configurational diagram of the mounting apparatus 10, FIG. 3 is a front view of a mounting head 12, FIG. 4 is a cross-sectional view taken along line A-A in FIG. 3, and FIGS. 5(a) and 5(b) are a schematic configurational diagrams of the mounting head 12.

The mounting apparatus 10 is an apparatus that mounts a semiconductor chip as an electronic component in a face-down state to a substrate 100, and is a flip-chip mounting apparatus 10, for example. The mounting apparatus 10 includes the mounting head 12 having a mounting tool 14, chip feeding means for feeding a semiconductor chip to the mounting tool 14 (not illustrated), a substrate stage 50 on which the substrate 100 is placed, an XY stage 52 for moving the substrate stage 50 in an XY direction (in a horizontal direction), and the like.

The semiconductor chip is fed to the mounting tool 14 by the chip feeding means. Various configurations are conceivable as the chip feeding means. For example, it is possible to conceive of a configuration in which a semiconductor chip is picked up from a wafer placed on a wafer stage and transferred to an intermediate stage using an intermediate arm. In this case, the XY stage 52 transfers the intermediate stage immediately below the mounting tool 14, which picks up a semiconductor chip from the intermediate stage positioned immediately below the mounting tool 14.

Upon pickup of the semiconductor chip by the mounting tool 14, subsequently, the substrate 100 is transferred immediately below the mounting tool 14 by the XY stage 52. In this state, the mounting tool 14 moves down toward the substrate 100, performs mounting by bonding the semiconductor chip suctioned and held at a tip end of the tool onto the substrate 100.

The mounting head 12 is fixedly attached to a frame 54 that stands on a base 11 of the mounting apparatus 10, and its horizontal position is fixed. At an opposite position of the mounting head 12, the substrate stage 50 holding the substrate 100 is provided. The substrate stage 50 is provided with a heating device for heating the substrate 100 and the like. The substrate stage 50 is disposed on the XY stage 52, and moves in the horizontal direction as needed according to an instruction from a control unit 60.

The mounting head 12 is provided with, in addition to the mounting tool 14 for suction-holding a semiconductor chip, a first pressurizing mechanism and a second pressurizing mechanism that move the mounting tool 14 in a vertical direction to apply a load to a semiconductor chip, a supporting mechanism that supports the mounting tool 14 in a manner freely movable up and down, and a base member 16 fixedly attached to the frame 54.

The base member 16 is a member fixedly attached to the frame 54. A horizontal position and a vertical position of the base member 16 are fixed. To the base member 16, a Z axis motor 18 that constitutes a first pressurizing mechanism, and a Z axis guide rail 17 that guides up and down movement of the supporting mechanism are attached.

The supporting mechanism supports the mounting tool 14 and the second pressurizing mechanism slidably in the vertical direction. The supporting mechanism is provided with a moving body 24 assembled to the Z axis guide rail 17, a motor holder 26, a movement block 28, and the like. The moving body 24, the motor holder 26, and the movement block 28 are coupled to each other, and together slide in the vertical direction. The motor holder 26 is a member for holding a voice coil motor (hereinafter referred to as a "VCM") 30 that constitutes the second pressurizing mechanism. On an upper side of the motor holder 26, there is provided the movement block 28 with which a lead screw 22 that constitutes the first pressurizing mechanism is threaded. As the lead screw 22 rotates, the movement block 28 moves up and down, and in turn, the motor holder 26 the moving body 24, the VCM 30, and the mounting tool 14 that are coupled to the movement block 28 move up and down.

The first pressurizing mechanism is a movement mechanism that moves the mounting tool 14 together with the supporting mechanism in the vertical direction, and is a mechanism that applies a relatively high first load to a semiconductor chip. By the first pressurizing mechanism, the mounting tool 14 moves downward toward the substrate 100, and a semiconductor chip suctioned and held at a tip end of the mounting tool 14 is pressed against the substrate 100. At this time, the load applied to the semiconductor chip takes a relatively high value, e.g. from 10 N to 500 N.

The first pressurizing mechanism includes the Z axis motor 18 coupled to the base member 16, and the lead screw 22 coupled to an output shaft of the Z axis motor 18 via a coupling 20. As the Z axis motor 18 is driven, the lead screw 22 rotates, and the movement block 28, and in turn, the second pressurizing mechanism and the mounting tool 14 move up and down. The control unit 60 performs feedback control of driving of the Z axis motor 18 based on a detection pressure detected by a load cell 38 that will be later described. It should be noted that the configuration of the first pressurizing mechanism described here is one example, and the configuration of the first pressurizing mechanism is not particularly limited as long as the mounting tool 14, the second pressurizing mechanism, and the supporting mechanism may be moved together in the vertical direction. For example, as a drive source of the pressurizing mechanism, an air cylinder, a hydraulic cylinder, or the like may be used instead of the motor.

The second pressurizing mechanism is a movement mechanism that is disposed between the supporting mechanism and the mounting tool 14, and that moves the mounting tool 14 with respect to the supporting mechanism. As compared to the first pressurizing mechanism, the second pressurizing mechanism applies a relatively low second load to the semiconductor chip. By the second pressurizing mechanism, the mounting tool 14 moves downward toward the substrate 100, and the semiconductor chip suctioned and held at a tip end of the mounting tool 14 is pressed against the substrate 100. At this time, the load applied to the semiconductor chip takes a relatively low value, e.g. from 0.1 N to 50 N.

The second pressurizing mechanism employs the VCM 30 as a drive source. The VCM 30 includes a stator 32 substantially in a cylindrical shape having permanent magnets arranged along its inner peripheral surface, and a mover 34 disposed within the stator 32 concentrically with the stator 32. The stator 32 is held by the motor holder 26. The mover 34 is a member substantially in a cylindrical shape around which a coil is wound, and moves forward and backward with respect to the stator 32 in an axial direction by applying current to the coil. The control unit 60 performs feedforward control of a current or a voltage of the coil in order to obtain a desired thrust force (bonding load). It should be noted that the configuration of the second pressurizing mechanism described here is one example, and the configuration of the second pressurizing mechanism is not particularly limited as long as the mounting tool 14 may be moved in the vertical direction with respect to the supporting mechanism. However, it is desirable that the second pressurizing mechanism be a mechanism that can be controlled by feedforward control with high accuracy.

To the mover 34 of the VCM 30, a sliding shaft 36 is coupled. The sliding shaft 36 is a member disposed between the mover 34 and the mounting tool 14, and moves in the vertical direction together with the mover 34. To the supporting mechanism, a protective member 44 that covers around the sliding shaft 36 is fixedly attached. The protective member 44 includes a through hole whose diameter is slightly larger than that of the sliding shaft 36, and the sliding shaft 36 moves forward and backward through the through hole. At a tip end of the sliding shaft 36, the mounting tool 14 that suctions and holds a semiconductor chip is attached. The configuration of the mounting tool 14 is not described herein, as a known configuration may be used.

As can be seen clearly from FIG. 4 and FIGS. 5(a) and 5(b), while a part of the sliding shaft 36 is covered by the protective member 44, the remaining part of the shaft is exposed outside. To the exposed part of the sliding shaft 36, a leaf spring 40 is attached. The leaf spring 40 functions as a guiding mechanism that guides the sliding shaft 36 to move in the vertical direction. Specifically, the leaf spring 40 is constituted by a steel plate disposed substantially horizontally, one end of which is coupled to a peripheral surface of the sliding shaft 36, and the other end of which is coupled to the moving body 24 of the supporting mechanism. The leaf spring 40 may be displaced in the vertical direction by being flexed in the vertical direction. By coupling the one end of the leaf spring 40 to the sliding shaft 36, movement of the sliding shaft 36, and in turn, the mounting tool 14 by the second pressurizing mechanism is restricted in the horizontal direction, and allowed only in the vertical direction. In this embodiment, the leaf spring 40 is used. However, an elastic body of a different type, e.g., a coil spring or the like, may be used in place of the leaf spring 40, as long as the elastic body is configured such that its movement is substantially restricted in the horizontal direction and allowed in the vertical direction. While it is possible to further improve accuracy in position control of the mounting tool 14 by guiding the moving direction of the mounting tool 14 using the elastic body in this manner, details of such control will be described later.

Between the mover 34 of the VCM 30 and the motor holder 26, the load cell 38 is provided. The load cell 38 is a pressure detector for detecting a load applied to a semiconductor chip via the mounting tool 14. A range of motion of the VCM 30 is set such that at least the VCM 30 may assume a first state in which a gap is produced between the load cell 38 and the motor holder 26 (a state shown in FIG. 5(a)), and a second state in which the load cell 38 is in contact with the motor holder 26 (the supporting mechanism) (a state shown in FIG. 5(b)). As will be described in detail later, when a relatively high load is applied using the first pressurizing mechanism, the VCM 30 is caused to assume the second state to generate precompression in the load cell 38. Further, when a relatively low load is applied using the second pressurizing mechanism, the VCM 30 is caused to assume the first state to bring the load cell 38 into an unloaded state. In this embodiment, the load cell 38 is connected to the mounting tool 14 via a separate member (the sliding shaft 36). However, the load cell 38 may be directly connected to the mounting tool 14.

To the supporting mechanism, a linear scale 42 is also fixedly attached. The linear scale 42 measures a displacement amount of the sliding shaft 36, and in turn, the mounting tool 14 with respect to the supporting mechanism. Then, the linear scale 42 detects a position of the mounting tool 14 in a Z-axial direction based on the displacement amount.

The control unit 60 is provided with a CPU 62 that performs various types of arithmetic processing, a memory 64 that records various data and programs, and a data interface 66 that manages input and output of data. The memory 64 records programs for executing mounting control and various data. Further, the CPU 62 executes various types of arithmetic processing based on values detected by sensors such as the load cell 38 and the linear scale 42, and outputs control signals for driving the pressurizing mechanism, the XY stage 52, a heater provided for the substrate stage 50, and the like through the data interface 66 according to the programs recorded in the memory 64.

A flow for mounting a semiconductor chip onto the substrate 100 by the mounting tool 14 having the above configuration will be now described. When a semiconductor chip is mounted onto the substrate 100, naturally, a semiconductor chip is suctioned and held a the tip end of the mounting tool 14, and the semiconductor chip in this state is pressed against the substrate 100. At this time, a load applied to the semiconductor chip varies depending on a type of the semiconductor chip, progress of a mounting process, and the like. For example, the semiconductor chip is bonded to the substrate 100 via a connecting member, and if the connecting member is a paste-like adhesive agent, a relatively low value from about 0.1 N to 50 N is sufficient as the bonding load. On the other hand, if the connecting member is an anisotropically conductive sheet, a solder bump, or the like, a relatively high bonding load from about 10 N to 500 N is required. Further, depending on the types of the semiconductor chip and the substrate 100, the load may be changed during mounting. For example, there is a case in which temporary mounting is first performed to press the semiconductor chip against the substrate 100 at a relatively low load, and then real mounting in which a relatively high load is applied is performed.

As described above, a range of the load applied to the semiconductor chip when bonding to the semiconductor chip is performed is vast (e.g., 0.1 N to 500 N). If the vast range of the load is to be covered using only one pressurizing mechanism, it is necessary to use a drive source whose range of output torque is wide and capable of performing highly accurate control. However, such a drive source is usually very expensive and large in size, and therefore it is difficult to employ such a drive source. Therefore, conventionally, different components are often replaced depending on the load to be applied, high and low, to cover the vast range of the load. However, this has been inconvenient. Thus, in this embodiment, in order to cover the vast range of the load, the first pressurizing mechanism for applying a high load and the second pressurizing mechanism for applying a low load are provided.

Describing more specifically, when it is desired to mount a semiconductor chip at a low load, a load is generated using the second pressurizing mechanism having the VCM 30 as a drive source. Specifically, the VCM 30 of the second pressurizing mechanism is driven to move the mounting tool 14 downward toward the substrate 100. At this time, the load cell 38 is apart from the motor holder 26 in the unloaded state, and the load may not be detected. However, as described above, the second pressurizing mechanism performs feedforward control of a current or a voltage of the VCM 30 in order to obtain a desired thrust force (load). Therefore, there is no problem if the load cell 38 is in the unloaded state.

When the mounting tool 14 is moved downward, the control unit 60 monitors the position of the mounting tool 14 in the Z-axial direction based on the displacement amount detected by the linear scale 42, and detects timing at which the semiconductor chip held by the mounting tool 14 is brought into contact with the substrate 100 based on a result of the monitoring. Upon contact of the semiconductor chip into the substrate 100, the control unit 60 performs drive control of a current or a voltage of the VCM 30 so that a prescribed load is to be applied to the semiconductor chip. Then, after predetermined pressing time passes, the mounting tool 14 is moved to a standby position apart from the substrate 100 by releasing a suction force of the mounting tool 14 and by driving the VCM 30 in an opposite direction. Here, if a final load is to be generated by the second pressurizing mechanism, it is possible to drive the first pressurizing mechanism to bring the mounting tool 14 into contact with the substrate 100 before generation of the load (specifically, before the semiconductor chip is brought into contact with the substrate 100).

On the other hand, if the semiconductor chip is to be mounted at a high load, the load is generated by the first pressurizing mechanism having the Z axis motor 18 as a drive source. Here, the Z axis motor 18 of the first pressurizing mechanism is subjected to feedback control based on a detection pressure value from the load cell 38. Therefore, when the semiconductor chip is to be mounted at a high load, in advance, the VCM 30 is driven, the load cell 38 is brought into contact with the supporting mechanism (the motor holder 26), and precompression is applied to the load cell 38. Specifically, the control unit 60 drives the VCM 30 upward in the Z-axial direction, and stops the VCM 30 at a position when the detection pressure value supplied from the load cell 38 reaches the prescribed precompression value.

Upon generation of precompression in the load cell 38, the control unit 60 then drives the Z axis motor 18 to move the mounting tool 14 downward together with the supporting mechanism. When the semiconductor chip held by the mounting tool 14 is brought into contact with the substrate 100, the detection pressure value supplied from the load cell 38 changes. Upon detection of this change, in order to obtain a specified load, the control unit 60 performs feedback control of the output torque of the Z axis motor 18 based on a value output from the load cell 38. Then, after desired pressing time passes, the mounting tool 14 is moved to a standby position apart from the substrate 100 by releasing a suction force of the mounting tool 14 and by driving the Z axis motor 18 in an opposite direction.

According to this embodiment, as can be seen clearly from the previous description, a vast range of the load may be covered without replacing the components. As a result, it is possible to improve versatility of the mounting apparatus 10. Further, according to this embodiment, as can be seen clearly from the previous description, the drive sources (the Z axis motor 18 and the VCM 30) that is driven may be switched when the load is applied, and it is possible to switch between the low load and the high load only by driving the VCM 30 to have the load cell 38 be in contact or contactless with the supporting mechanism. In other words, when switching between the low load and the high load, it is possible to downsize the apparatus as a whole and reduce costs without providing a complicated mechanism.

Further, according to this embodiment, when the mounting tool 14 is moved by the second pressurizing mechanism, the moving direction of the mounting tool 14 is guided by the leaf spring 40. With this, it is possible to reduce friction due to the movement, and to improve accuracy in the control of the position of the mounting tool 14.

Specifically, in general, a slider guide having a roller (rolling element) or the like is often used for linear movement. However, with a guiding mechanism employing such a rolling element, a sliding resistance often increases momentarily due to reasons such as loosening of the mechanism and a fluid resistance of lubricant oil. The momentary increase of the sliding resistance results in momentary positional displacement. Such a momentary increase of the sliding resistance particularly tends to occur when the thrust torque is small.

Thus, in this embodiment, the leaf spring 40 is employed as a guiding mechanism for the case in which the mounting tool 14 is moved using the VCM 30 having small output torque. Specifically, by coupling the sliding shaft 36 and the supporting mechanism via the leaf spring 40, the moving direction of the sliding shaft 36 with respect to the supporting mechanism is limited to a direction of displacement of the leaf spring 40, that is, the vertical direction. As a result, the moving direction of the sliding shaft 36, and in turn, the mounting tool 14 is guided in the vertical direction. Further, as loosening, a fluid resistance of lubricant oil, or the like does not occur when the leaf spring 40 is employed, unlike the case of a guiding mechanism employing a rolling element, a momentary increase of the sliding resistance due to such reasons is not produced. As a result, employment of the guiding mechanism using the leaf spring 40 allows smooth movement of the mounting tool 14 by the VCM 30 without causing momentary positional displacement.

Figure 6:
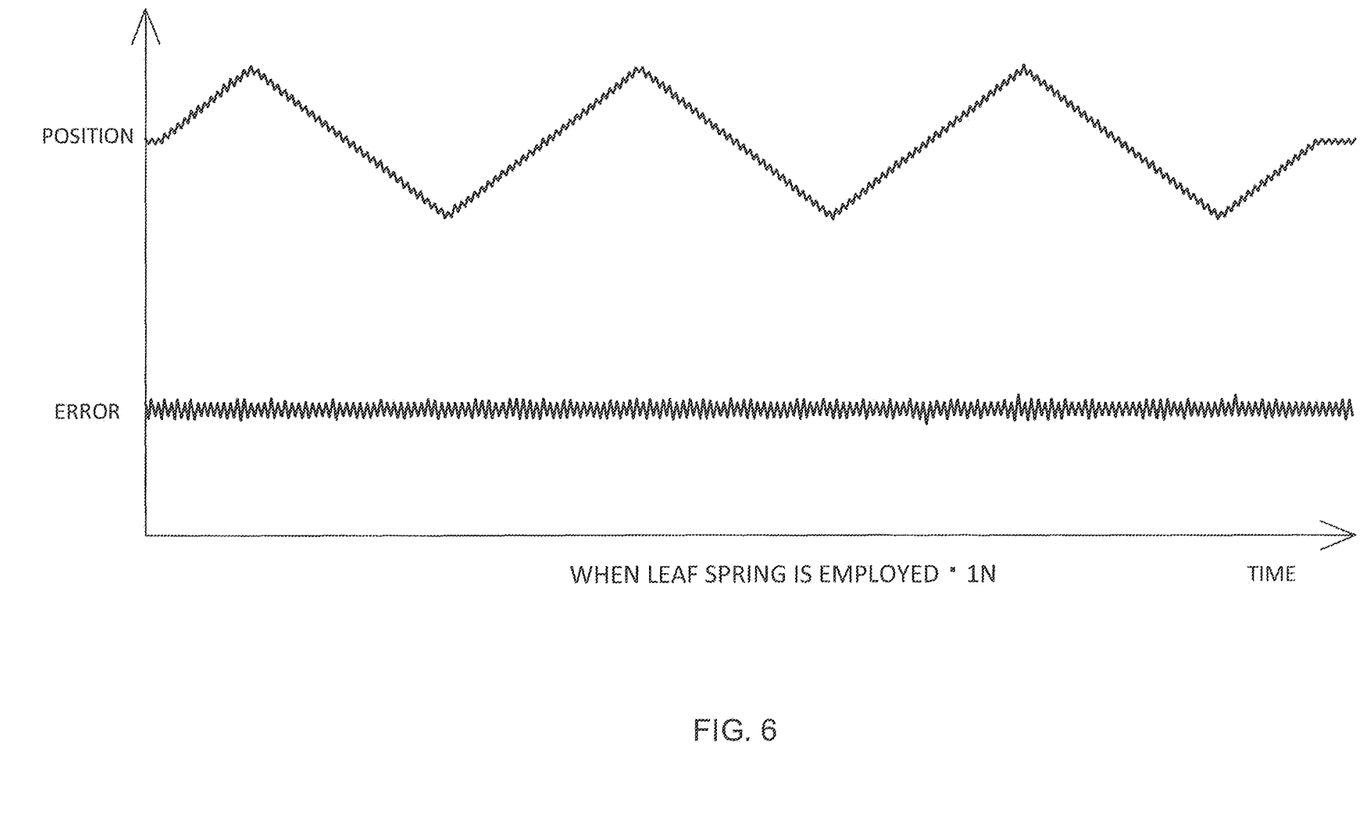
FIG. 6 is a chart showing positions and errors when a mounting tool is caused to make reciprocating up-down movement with 1-N thrust torque in a case in which a guiding mechanism using a leaf spring is employed.
Figure 7:
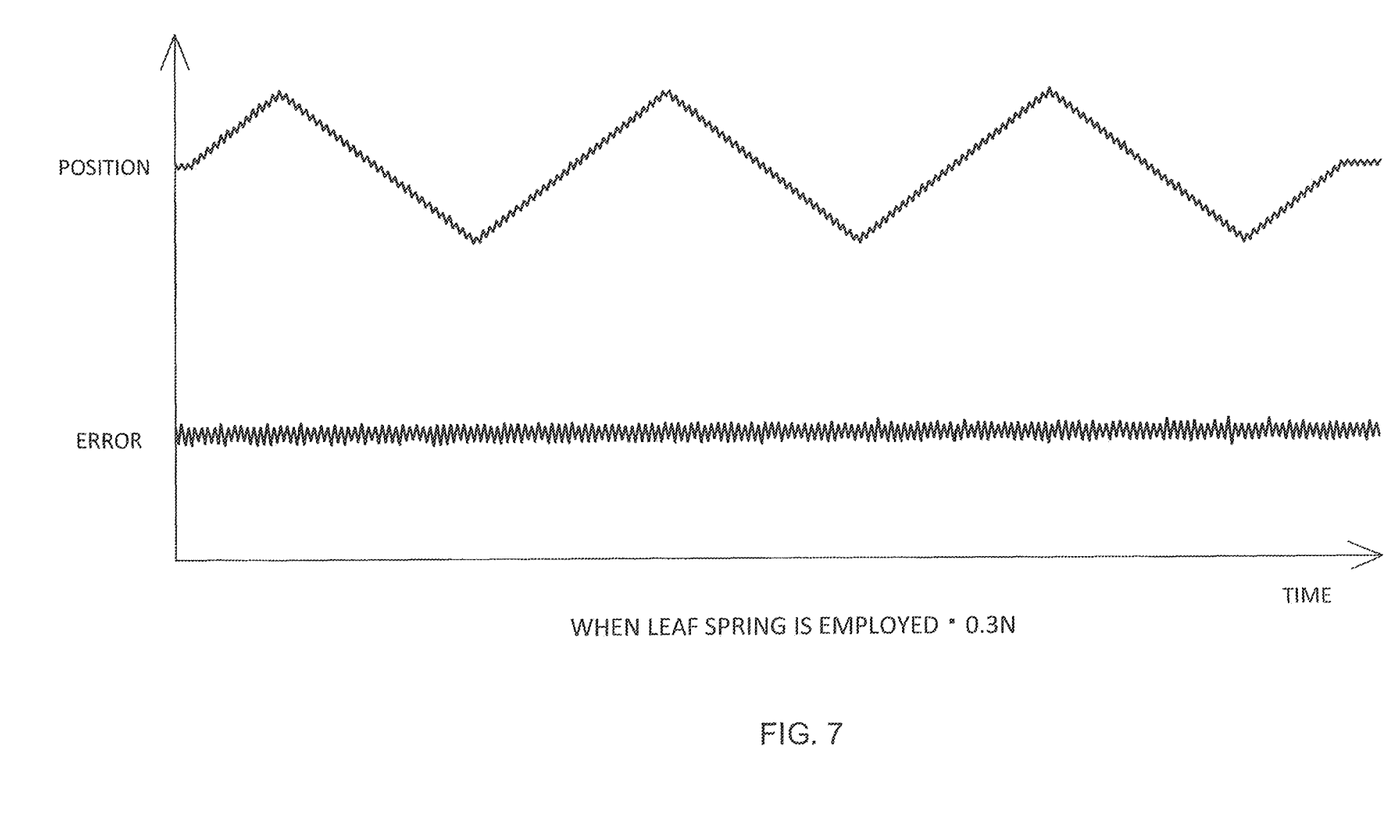
FIG. 7 is a chart showing positions and errors when a mounting tool is caused to make reciprocating up-down movement with 0.3-N thrust torque in a case in which the guiding mechanism using a leaf spring is employed.
Figure 8:
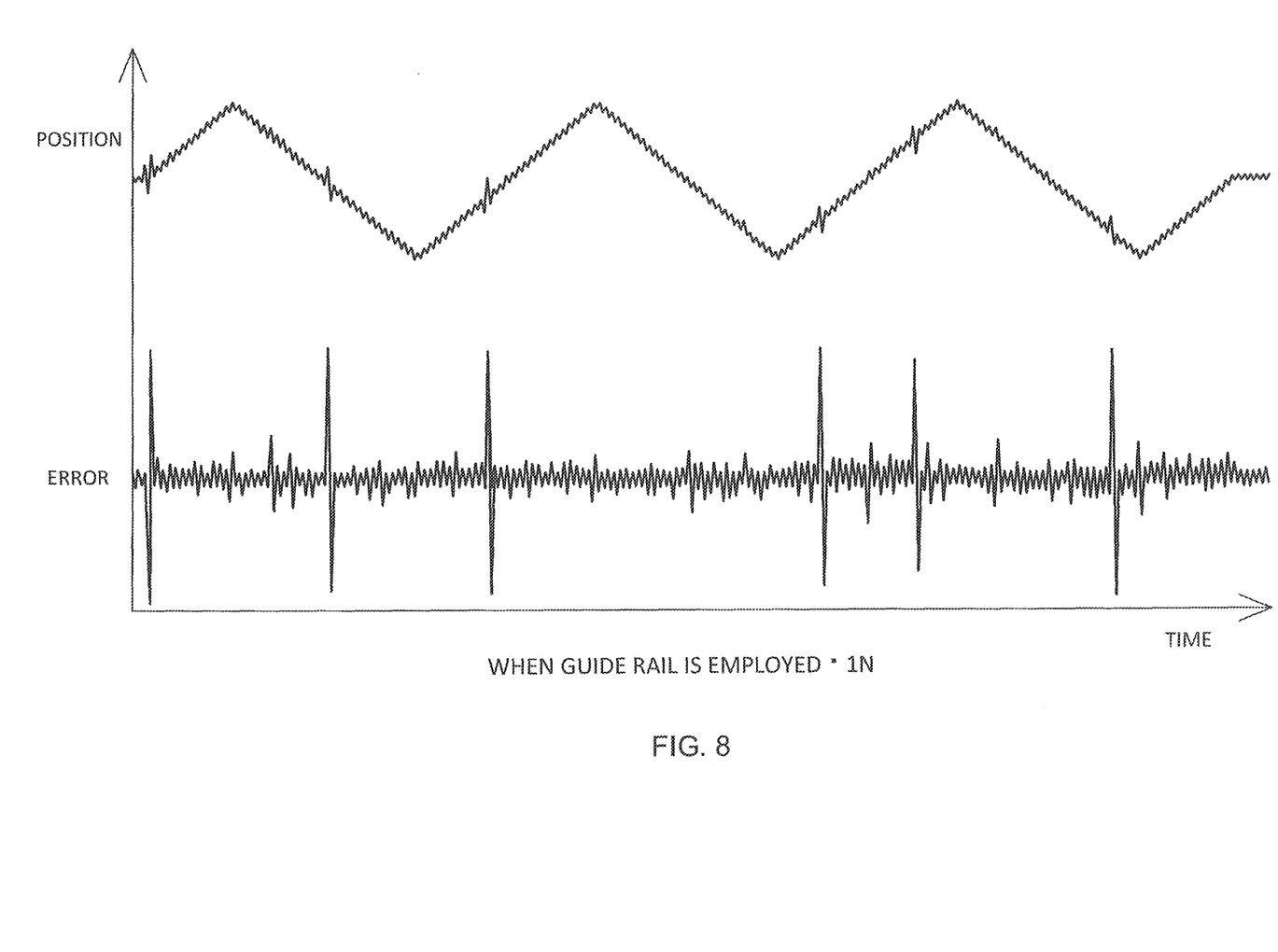
FIG. 8 is a chart showing positions and errors when a mounting tool is caused to make reciprocating up-down movement with 1-N thrust torque in a case in which a guide rail is employed.

FIG. 6 through FIG. 8 are charts showing actually measured positions (upper side of the chart) and amounts of position errors (lower side of the chart) of the mounting tool 14 when the mounting tool 14 is moved reciprocatingly up and down by the VCM 30. FIG. 6 and FIG. 7 show experimental results when the leaf spring 40 is employed as the guiding mechanism, and FIG. 8 shows an experimental result when a guide rail is employed as the guiding mechanism. Further, the thrust torque is 1 N in FIG. 6 and FIG. 8, and the thrust torque is 0.3 N in FIG. 7.

As can be seen clearly from FIG. 8, when the guide rail is employed, the position is often momentarily displaced to a large extent. On the other hand, as illustrated in FIG. 6 and FIG. 7, when the leaf spring 40 is employed, the position is not momentarily displaced to a large extent, and stable reciprocating up-down movement is performed. This also applies to the case in which the thrust torque is small (0.3 N).

In other words, according to this embodiment, it is possible to effectively prevent positional displacement of the mounting tool 14 by employing an elastic member like the leaf spring 40 as a guiding mechanism for the movement by the second pressurizing mechanism.

It should be noted that the configuration described above is one example, and may be modified as appropriate as long as the configuration defined in claim 1 of the present application is provided. For example, while the leaf spring 40 is employed as a guiding member for the movement by the second pressurizing mechanism in this embodiment, a different guiding member may be employed as long as the momentary positional displacement described above may be prevented. Further, while the mounting head 12 is configured not to move in the horizontal direction in this embodiment, it should be understood that the mounting head 12 may be configured not to move in the horizontal direction.

The present invention is not limited to the embodiment described above, and includes any alteration and modification without departing from the technical scope and the spirit of the present invention as defined in the appended claims.

REFERENCE SIGNS LIST

10: Mounting apparatus
11: Base
12: Mounting head
14: Mounting tool
16: Base member
17: Shaft guide rail
18: Shaft motor
20: Coupling
22: Lead screw
24: Moving body
26: Motor holder
28: Movement block
32: Stator
34: Mover
36: Sliding shaft
38: Load cell
40: Leaf spring
42: Linear scale
44: Protective member
50: Substrate stage
52: XY stage
54: Frame
100: Substrate

The invention claimed is:

1. An electronic component mounting apparatus for mounting an electronic component onto a substrate, the apparatus comprising:

a mounting tool configured to hold the electronic component at a tip end of the tool;
a base member to which a guide rail for guiding up-and-down movement in a vertical direction of the mounting tool is attached, and a position of which in a horizontal direction and in the vertical direction is fixed;
a second pressurizing mechanism configured to be movable in the vertical direction and provided between the base member and the mounting tool, the second pressurizing mechanism having a supporting mechanism configured by coupling a moving body assembled to the guide rail with a motor folder that holds a drive unit of the second pressurizing mechanism, the second pressurizing mechanism being configured to move the mounting tool in the vertical direction with respect to the supporting mechanism to apply a second load to the electronic component;
a first pressurizing mechanism having a transmission shaft attached to the base member, and configured to move the mounting tool in the vertical direction and to transmit a first load to the electronic component, the transmission shaft applying the first load to the electronic component by directly driving the motor folder vertically downward;
a sliding shaft configured to transmit a load to the electronic component via the mounting tool, the sliding shaft being provided between the second pressurizing mechanism and the mounting tool, the sliding shaft having a lower end to which the mounting tool is attached, the sliding shaft extending along the vertical direction;
a load sensor located between the sliding shaft and the second pressurizing mechanism, and directly or indirectly connected to the mounting tool; and
a control unit configured to control driving of the first pressurizing mechanism and the second pressurizing mechanism, the control unit controlling so as to, when the first load is applied by the first pressurizing mechanism, drive the second pressurizing mechanism to a vertically upward direction previously and bring the load sensor into contact with the supporting mechanism to produce precompression; and
a leaf spring as a guiding mechanism configured to restrict displacement in the horizontal direction and to permit displacement in the vertical direction of the mounting tool with respect to the moving body, the leaf spring having one end directly coupled to the sliding shaft near the mounting tool and the other end directly coupled to the moving body of the supporting mechanism, wherein
the leaf spring has a cantilever structure including an upper leaf spring and a lower leaf spring, and
the control unit moves the second pressurizing mechanism in the vertical direction within a range in which the leaf spring strokes substantially in the vertical direction.

2. The electronic component mounting apparatus according to claim 1, wherein
the control unit controls so that, when the first load is applied to the electronic component by the first pressurizing mechanism, the second load is applied to the electronic component by the second pressurizing mechanism to perform temporary mounting of the electronic component, and then the first load is applied by the first pressurizing mechanism.

* * * * *